US010192696B2

(12) United States Patent
Zercoe et al.

(10) Patent No.: US 10,192,696 B2
(45) Date of Patent: Jan. 29, 2019

(54) LIGHT-EMITTING ASSEMBLY FOR KEYBOARD

(71) Applicant: Apple Inc., Cupertino, CA (US)

(72) Inventors: Bradford J. Zercoe, Cupertino, CA (US); Craig C. Leong, Cupertino, CA (US); Keith J. Hendren, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/867,746

(22) Filed: Sep. 28, 2015

(65) Prior Publication Data

US 2016/0093452 A1 Mar. 31, 2016

Related U.S. Application Data

(60) Provisional application No. 62/129,842, filed on Mar. 7, 2015, provisional application No. 62/129,840, filed on
(Continued)

(51) Int. Cl.
*H01H 13/83* (2006.01)
*H01H 13/06* (2006.01)
(Continued)

(52) U.S. Cl.
CPC ............ *H01H 13/06* (2013.01); *G06F 1/1662* (2013.01); *G06F 3/0202* (2013.01); *H01H 3/125* (2013.01);
(Continued)

(58) Field of Classification Search
CPC ........ H01H 13/06; H01H 13/04; H01H 13/86; H01H 13/7006; H01H 13/79; H01H 13/80;
(Continued)

(56) References Cited

U.S. PATENT DOCUMENTS 3,657,492 A 4/1972 Arndt et al.
3,917,917 A 11/1975 Murata
(Continued)

FOREIGN PATENT DOCUMENTS

CN 2155620 2/1994
CN 2394309 8/2000
(Continued)

OTHER PUBLICATIONS

Elekson, "Reliable and Tested Wearable Electronics Embedment Solutions," http://www.wearable.technology/our-technologies, 3 pages, at least as early as Jan. 6, 2016.
(Continued)

*Primary Examiner* — Edwin A. Leon
*Assistant Examiner* — Lheiren Mae A Caroc
(74) *Attorney, Agent, or Firm* — Dorsey & Whitney LLP

(57) ABSTRACT

A light-emitting assembly positioned within a switch housing of a keyboard assembly for an electronic device is disclosed. The light-emitting assembly may include a phosphor structure, a transparent material positioned on opposing side surfaces of the phosphor structure, and an epoxy layer formed over an entire back surface of the phosphor structure and the transparent material. The light-emitting assembly may also include a mask layer formed over an entire top surface of: the phosphor structure, the transparent material, and the epoxy layer. The light-emitting assembly may further include a light source positioned within the phosphor structure for emitting a light.

20 Claims, 8 Drawing Sheets

Related U.S. Application Data on Mar. 7, 2015, provisional application No. 62/129,843, filed on Mar. 7, 2015, provisional application No. 62/129,841, filed on Mar. 7, 2015, provisional application No. 62/058,067, filed on Sep. 30, 2014, provisional application No. 62/058,087, filed on Sep. 30, 2014, provisional application No. 62/058,081, filed on Sep. 30, 2014, provisional application No. 62/058,074, filed on Sep. 30, 2014.

(51) Int. Cl.

| | | |
|---|---|---|
| *H01H 13/02* | (2006.01) | |
| *H01L 33/50* | (2010.01) | |
| *H01H 13/70* | (2006.01) | |
| *G06F 1/16* | (2006.01) | |
| *G06F 3/02* | (2006.01) | |
| *H01H 3/12* | (2006.01) | |
| *H01H 13/79* | (2006.01) | |
| *H01H 13/80* | (2006.01) | |
| *H01H 13/803* | (2006.01) | |
| *H01H 13/86* | (2006.01) | |
| *H01H 13/04* | (2006.01) | |

(52) U.S. Cl.
CPC .......... *H01H 13/023* (2013.01); *H01H 13/04* (2013.01); *H01H 13/70* (2013.01); *H01H 13/7006* (2013.01); *H01H 13/79* (2013.01); *H01H 13/80* (2013.01); *H01H 13/803* (2013.01); *H01H 13/83* (2013.01); *H01H 13/86* (2013.01); *H01L 33/50* (2013.01); *H01H 2203/004* (2013.01); *H01H 2203/038* (2013.01); *H01H 2203/056* (2013.01); *H01H 2205/016* (2013.01); *H01H 2205/024* (2013.01); *H01H 2207/04* (2013.01); *H01H 2211/028* (2013.01); *H01H 2213/01* (2013.01); *H01H 2213/016* (2013.01); *H01H 2215/038* (2013.01); *H01H 2219/036* (2013.01); *H01H 2219/052* (2013.01); *H01H 2219/06* (2013.01); *H01H 2219/062* (2013.01); *H01H 2221/076* (2013.01); *H01H 2227/026* (2013.01); *H01H 2229/046* (2013.01); *H01H 2239/004* (2013.01)

(58) Field of Classification Search
CPC ...... H01H 13/803; H01H 13/83; H01H 3/125; H01H 13/82; H01H 13/70; H01H 13/023; G06F 1/1662; G06F 3/0202; H01L 33/50; H01L 33/56
USPC .......................................... 200/310–314, 317
See application file for complete search history.

(56) References Cited

U.S. PATENT DOCUMENTS

| | | |
|---|---|---|
| 3,978,297 A | 8/1976 | Lynn et al. |
| 4,095,066 A | 6/1978 | Harris |
| 4,319,099 A | 3/1982 | Asher |
| 4,349,712 A | 9/1982 | Michalski |
| 4,484,042 A | 11/1984 | Matsui |
| 4,596,905 A | 6/1986 | Fowler |
| 4,598,181 A | 7/1986 | Selby |
| 4,670,084 A | 6/1987 | Durand et al. |
| 4,755,645 A | 7/1988 | Naoki et al. |
| 4,937,408 A | 6/1990 | Hattori et al. |
| 4,987,275 A | 1/1991 | Miller et al. |
| 5,021,638 A | 6/1991 | Nopper et al. |
| 5,092,459 A | 3/1992 | Uljanic et al. |
| 5,136,131 A | 8/1992 | Komaki |
| 5,278,372 A | 1/1994 | Takagi et al. |
| 5,280,146 A | 1/1994 | Inagaki et al. |
| 5,340,955 A | 8/1994 | Calvillo et al. |
| 5,382,762 A | 1/1995 | Mochizuki |
| 5,397,867 A | 3/1995 | Demeo |
| 5,408,060 A * | 4/1995 | Muurinen ................ G05G 1/02 200/310 |
| 5,421,659 A | 6/1995 | Liang |
| 5,422,447 A | 6/1995 | Spence |
| 5,457,297 A | 10/1995 | Chen |
| 5,477,430 A * | 12/1995 | Larose .................... G09F 13/20 200/314 |
| 5,481,074 A | 1/1996 | English |
| 5,504,283 A | 4/1996 | Kako et al. |
| 5,512,719 A | 4/1996 | Okada et al. |
| 5,625,532 A | 4/1997 | Sellers |
| 5,804,780 A | 9/1998 | Bartha |
| 5,828,015 A | 10/1998 | Coulon |
| 5,847,337 A | 12/1998 | Chen |
| 5,874,700 A | 2/1999 | Hochgesang |
| 5,875,013 A | 2/1999 | Takahara |
| 5,876,106 A * | 3/1999 | Kordecki ............... G01D 5/165 200/314 |
| 5,878,872 A | 3/1999 | Tsai |
| 5,881,866 A | 3/1999 | Miyajima et al. |
| 5,898,147 A | 4/1999 | Domzaiski et al. |
| 5,924,555 A | 7/1999 | Sadamori et al. |
| 5,935,691 A | 8/1999 | Tsai |
| 5,960,942 A | 10/1999 | Thornton |
| 5,986,227 A | 11/1999 | Hon |
| 6,020,565 A | 2/2000 | Pan |
| 6,068,416 A | 5/2000 | Kumamoto et al. |
| 6,215,420 B1 | 4/2001 | Harrison et al. |
| 6,257,782 B1 | 7/2001 | Maruyama et al. |
| 6,259,046 B1 | 7/2001 | Iwama et al. |
| 6,377,685 B1 | 4/2002 | Krishnan |
| 6,388,219 B2 | 5/2002 | Hsu et al. |
| 6,423,918 B1 | 7/2002 | King et al. |
| 6,482,032 B1 | 11/2002 | Szu et al. |
| 6,530,283 B2 | 3/2003 | Okada et al. |
| 6,538,801 B2 | 3/2003 | Jacobson et al. |
| 6,542,355 B1 | 4/2003 | Huang |
| 6,552,287 B2 | 4/2003 | Janniere |
| 6,556,112 B1 | 4/2003 | Van Zeeland et al. |
| 6,559,399 B2 | 5/2003 | Hsu et al. |
| 6,560,612 B1 | 5/2003 | Yamada et al. |
| 6,572,289 B2 | 6/2003 | Lo et al. |
| 6,573,463 B2 | 6/2003 | Ono |
| 6,585,435 B2 | 7/2003 | Fang |
| 6,624,369 B2 | 9/2003 | Ito et al. |
| 6,706,986 B2 | 3/2004 | Hsu |
| 6,738,050 B2 | 5/2004 | Comiskey |
| 6,750,414 B2 | 6/2004 | Sullivan |
| 6,759,614 B2 | 7/2004 | Yoneyama |
| 6,762,381 B2 | 7/2004 | Kunthady et al. |
| 6,765,503 B1 * | 7/2004 | Chan ...................... G05G 1/105 200/310 |
| 6,788,450 B2 | 9/2004 | Kawai et al. |
| 6,797,906 B2 | 9/2004 | Ohashi |
| 6,850,227 B2 | 2/2005 | Takahashi et al. |
| 6,860,660 B2 | 3/2005 | Hochgesang et al. |
| 6,911,608 B2 | 6/2005 | Levy |
| 6,926,418 B2 | 8/2005 | Ostergard et al. |
| 6,940,030 B2 | 9/2005 | Takeda et al. |
| 6,977,352 B2 | 12/2005 | Oosawa |
| 6,979,792 B1 | 12/2005 | Lai |
| 6,987,466 B1 | 1/2006 | Welch et al. |
| 6,987,503 B2 | 1/2006 | Inoue |
| 7,012,206 B2 | 3/2006 | Oikawa |
| 7,030,330 B2 | 4/2006 | Suda |
| 7,038,832 B2 | 5/2006 | Kanbe |
| 7,129,930 B1 | 10/2006 | Cathey et al. |
| 7,134,205 B2 | 11/2006 | Bruennel |
| 7,146,701 B2 | 12/2006 | Mahoney et al. |
| 7,151,236 B2 | 12/2006 | Ducruet et al. |
| 7,151,237 B2 | 12/2006 | Mahoney et al. |
| 7,154,059 B2 | 12/2006 | Chou |
| 7,166,813 B2 | 1/2007 | Soma |
| 7,172,303 B2 | 2/2007 | Shipman et al. |
| 7,189,932 B2 | 3/2007 | Kim |

(56) References Cited

U.S. PATENT DOCUMENTS

| | | |
|---|---|---|
| 7,256,766 B2 | 8/2007 | Albert et al. |
| 7,283,119 B2 | 10/2007 | Kishi |
| 7,301,113 B2 | 11/2007 | Nishimura et al. |
| 7,312,790 B2 | 12/2007 | Sato et al. |
| 7,378,607 B2 | 5/2008 | Koyano et al. |
| 7,385,806 B2 | 6/2008 | Liao |
| 7,391,555 B2 | 6/2008 | Albert et al. |
| 7,414,213 B2 | 8/2008 | Hwang |
| 7,429,707 B2 | 9/2008 | Yanai et al. |
| 7,432,460 B2 | 10/2008 | Clegg |
| 7,510,342 B2 | 3/2009 | Lane et al. |
| 7,531,764 B1 | 5/2009 | Lev et al. |
| 7,541,554 B2 | 6/2009 | Hou |
| 7,589,292 B2 | 9/2009 | Jung et al. |
| 7,639,187 B2 | 12/2009 | Caballero et al. |
| 7,639,571 B2 | 12/2009 | Ishii et al. |
| 7,651,231 B2 * | 1/2010 | Chou ............... G02B 6/0021 362/23.03 |
| 7,679,010 B2 | 3/2010 | Wingett |
| 7,724,415 B2 | 5/2010 | Yamaguchi |
| 7,781,690 B2 | 8/2010 | Ishii |
| 7,813,774 B2 | 10/2010 | Perez-Noguera |
| 7,842,895 B2 | 11/2010 | Lee |
| 7,847,204 B2 | 12/2010 | Tsai |
| 7,851,819 B2 | 12/2010 | Shi |
| 7,866,866 B2 | 1/2011 | Wahlstrom |
| 7,893,376 B2 | 2/2011 | Chen |
| 7,923,653 B2 | 4/2011 | Ohsumi |
| 7,947,915 B2 | 5/2011 | Lee et al. |
| 7,999,748 B2 | 8/2011 | Ligtenberg et al. |
| 8,063,325 B2 | 11/2011 | Sung et al. |
| 8,077,096 B2 | 12/2011 | Chiang et al. |
| 8,080,744 B2 | 12/2011 | Yeh et al. |
| 8,098,228 B2 | 1/2012 | Shimodaira et al. |
| 8,109,650 B2 | 2/2012 | Chang et al. |
| 8,119,945 B2 | 2/2012 | Lin |
| 8,124,903 B2 | 2/2012 | Tatehata et al. |
| 8,134,094 B2 | 3/2012 | Tsao et al. |
| 8,143,982 B1 | 3/2012 | Lauder et al. |
| 8,156,172 B2 | 4/2012 | Muehl et al. |
| 8,178,808 B2 | 5/2012 | Strittmatter et al. |
| 8,184,021 B2 | 5/2012 | Chou |
| 8,212,160 B2 | 7/2012 | Tsao |
| 8,212,162 B2 | 7/2012 | Zhou |
| 8,218,301 B2 | 7/2012 | Lee |
| 8,232,958 B2 | 7/2012 | Tolbert |
| 8,246,228 B2 | 8/2012 | Ko et al. |
| 8,253,048 B2 | 8/2012 | Ozias et al. |
| 8,253,052 B2 | 9/2012 | Chen |
| 8,263,887 B2 | 9/2012 | Chen et al. |
| 8,289,280 B2 | 10/2012 | Travis |
| 8,299,382 B2 | 10/2012 | Takemae et al. |
| 8,317,384 B2 | 11/2012 | Chung et al. |
| 8,319,298 B2 | 11/2012 | Hsu |
| 8,325,141 B2 | 12/2012 | Marsden |
| 8,330,725 B2 | 12/2012 | Mahowald et al. |
| 8,354,629 B2 | 1/2013 | Lin |
| 8,378,857 B2 | 2/2013 | Pance |
| 8,383,972 B2 | 2/2013 | Liu |
| 8,384,566 B2 | 2/2013 | Bocirnea |
| 8,404,990 B2 | 3/2013 | Lutgring et al. |
| 8,451,146 B2 | 3/2013 | Mahowald et al. |
| 8,431,849 B2 | 4/2013 | Chen |
| 8,436,265 B2 | 5/2013 | Koike et al. |
| 8,462,514 B2 | 6/2013 | Myers et al. |
| 8,500,348 B2 | 8/2013 | Dumont et al. |
| 8,502,094 B2 | 8/2013 | Chen |
| 8,542,194 B2 | 9/2013 | Akens et al. |
| 8,548,528 B2 | 10/2013 | Kim et al. |
| 8,564,544 B2 | 10/2013 | Jobs et al. |
| 8,569,639 B2 | 10/2013 | Strittmatter |
| 8,575,632 B2 * | 11/2013 | Kuramoto ............ C08G 59/3245 257/96 |
| 8,581,127 B2 | 11/2013 | Jhuang et al. |
| 8,592,699 B2 | 11/2013 | Kessler et al. |
| 8,592,702 B2 | 11/2013 | Tsai |
| 8,592,703 B2 | 11/2013 | Johnson et al. |
| 8,604,370 B2 | 12/2013 | Chao |
| 8,629,362 B1 | 1/2014 | Knighton et al. |
| 8,642,904 B2 | 2/2014 | Chiba et al. |
| 8,651,720 B2 | 2/2014 | Sherman et al. |
| 8,659,882 B2 | 2/2014 | Liang et al. |
| 8,731,618 B2 | 5/2014 | Jarvis et al. |
| 8,748,767 B2 | 6/2014 | Ozias et al. |
| 8,759,705 B2 | 6/2014 | Funakoshi et al. |
| 8,760,405 B2 | 6/2014 | Nam |
| 8,786,548 B2 | 7/2014 | Oh et al. |
| 8,791,378 B2 | 7/2014 | Lan |
| 8,835,784 B2 | 9/2014 | Hirota |
| 8,847,090 B2 | 9/2014 | Ozaki |
| 8,847,711 B2 | 9/2014 | Yang et al. |
| 8,853,580 B2 | 10/2014 | Chen |
| 8,854,312 B2 | 10/2014 | Meierling |
| 8,870,477 B2 | 10/2014 | Merminod et al. |
| 8,884,174 B2 | 11/2014 | Chou et al. |
| 8,921,473 B1 | 12/2014 | Hyman |
| 8,922,476 B2 | 12/2014 | Stewart et al. |
| 8,943,427 B2 | 1/2015 | Heo et al. |
| 8,976,117 B2 | 3/2015 | Krahenbuhl et al. |
| 8,994,641 B2 | 3/2015 | Stewart et al. |
| 9,007,297 B2 | 4/2015 | Stewart et al. |
| 9,012,795 B2 | 4/2015 | Niu et al. |
| 9,029,723 B2 | 5/2015 | Pegg |
| 9,063,627 B2 | 6/2015 | Yairi et al. |
| 9,064,642 B2 | 6/2015 | Welch et al. |
| 9,086,733 B2 | 7/2015 | Pance |
| 9,087,663 B2 | 7/2015 | Los |
| 9,093,229 B2 | 7/2015 | Leong et al. |
| 9,213,416 B2 | 12/2015 | Chen |
| 9,223,352 B2 | 12/2015 | Smith et al. |
| 9,234,486 B2 | 1/2016 | Das et al. |
| 9,235,236 B2 | 1/2016 | Nam |
| 9,274,654 B2 | 3/2016 | Slobodin et al. |
| 9,275,810 B2 | 3/2016 | Pance et al. |
| 9,300,033 B2 | 3/2016 | Han et al. |
| 9,305,496 B2 | 4/2016 | Kimura |
| 9,443,672 B2 | 9/2016 | Martisauskas |
| 9,448,628 B2 | 9/2016 | Tan et al. |
| 9,471,185 B2 | 10/2016 | Guard |
| 9,477,382 B2 | 10/2016 | Hicks et al. |
| 9,612,674 B2 | 4/2017 | Degner et al. |
| 9,734,965 B2 | 8/2017 | Martinez et al. |
| 9,793,066 B1 | 10/2017 | Brock et al. |
| 2002/0079211 A1 | 6/2002 | Katayama et al. |
| 2002/0093436 A1 | 7/2002 | Lien |
| 2002/0113770 A1 | 8/2002 | Jacobson et al. |
| 2002/0149835 A1 | 10/2002 | Kanbe |
| 2003/0169232 A1 | 9/2003 | Ito |
| 2004/0004559 A1 | 1/2004 | Rast |
| 2004/0225965 A1 | 11/2004 | Garside et al. |
| 2004/0257247 A1 | 12/2004 | Lin et al. |
| 2005/0035950 A1 | 2/2005 | Daniels |
| 2005/0253801 A1 | 11/2005 | Kobayashi |
| 2006/0011458 A1 | 1/2006 | Purcocks |
| 2006/0020469 A1 | 1/2006 | Rast |
| 2006/0120790 A1 | 6/2006 | Chang |
| 2006/0181511 A1 | 8/2006 | Woolley |
| 2006/0243987 A1 | 11/2006 | Lai |
| 2007/0200823 A1 | 8/2007 | Bytheway et al. |
| 2007/0285393 A1 | 12/2007 | Ishakov |
| 2008/0131184 A1 | 6/2008 | Brown et al. |
| 2008/0136782 A1 | 6/2008 | Mundt et al. |
| 2008/0251370 A1 | 10/2008 | Aoki |
| 2009/0046053 A1 | 2/2009 | Shigehiro et al. |
| 2009/0103964 A1 | 4/2009 | Takagi et al. |
| 2009/0128496 A1 | 5/2009 | Huang |
| 2009/0262085 A1 | 10/2009 | Wassingbo et al. |
| 2009/0267892 A1 | 10/2009 | Faubert |
| 2010/0045705 A1 | 2/2010 | Vertegaal et al. |
| 2010/0066568 A1 | 3/2010 | Lee |
| 2010/0109921 A1 | 5/2010 | Annerfors |
| 2010/0156796 A1 | 6/2010 | Kim et al. |
| 2010/0253630 A1 | 10/2010 | Homma et al. |
| 2011/0032127 A1 | 2/2011 | Roush |

(56) References Cited

U.S. PATENT DOCUMENTS

| | | |
|---|---|---|
| 2011/0056817 A1 | 3/2011 | Wu |
| 2011/0056836 A1 | 3/2011 | Tatebe et al. |
| 2011/0205179 A1 | 8/2011 | Braun |
| 2011/0261031 A1 | 10/2011 | Muto |
| 2011/0267272 A1 | 11/2011 | Meyer et al. |
| 2011/0284355 A1 | 11/2011 | Yang |
| 2011/0303521 A1 | 12/2011 | Niu et al. |
| 2012/0012446 A1 | 1/2012 | Hwa |
| 2012/0032972 A1 | 2/2012 | Hwang |
| 2012/0090973 A1 | 4/2012 | Liu |
| 2012/0098751 A1 | 4/2012 | Liu |
| 2012/0286701 A1 | 11/2012 | Yang et al. |
| 2012/0298496 A1 | 11/2012 | Zhang |
| 2012/0313856 A1 | 12/2012 | Hsieh |
| 2013/0043115 A1 | 2/2013 | Yang et al. |
| 2013/0093500 A1 | 4/2013 | Bruwer |
| 2013/0093733 A1 | 4/2013 | Yoshida |
| 2013/0100030 A1 | 4/2013 | Los et al. |
| 2013/0120265 A1 | 5/2013 | Horii et al. |
| 2013/0161170 A1* | 6/2013 | Fan .................. H01H 13/83 200/5 A |
| 2013/0215079 A1 | 8/2013 | Johnson et al. |
| 2013/0242601 A1 | 9/2013 | Kloeppel et al. |
| 2013/0270090 A1 | 10/2013 | Lee |
| 2014/0015777 A1 | 1/2014 | Park et al. |
| 2014/0027259 A1 | 1/2014 | Kawana et al. |
| 2014/0071654 A1 | 3/2014 | Chien |
| 2014/0082490 A1 | 3/2014 | Jung et al. |
| 2014/0090967 A1 | 4/2014 | Inagaki |
| 2014/0098042 A1 | 4/2014 | Kuo et al. |
| 2014/0116865 A1 | 5/2014 | Leong et al. |
| 2014/0118264 A1 | 5/2014 | Leong et al. |
| 2014/0151211 A1 | 6/2014 | Zhang |
| 2014/0184496 A1 | 7/2014 | Gribetz et al. |
| 2014/0191973 A1 | 7/2014 | Zellers et al. |
| 2014/0218851 A1 | 8/2014 | Klein et al. |
| 2014/0252881 A1 | 9/2014 | Dinh et al. |
| 2014/0291133 A1 | 10/2014 | Fu et al. |
| 2014/0320436 A1 | 10/2014 | Modarres et al. |
| 2014/0346025 A1 | 11/2014 | Hendren et al. |
| 2014/0375141 A1 | 12/2014 | Nakajima |
| 2015/0016038 A1 | 1/2015 | Niu et al. |
| 2015/0083561 A1 | 3/2015 | Han et al. |
| 2015/0090570 A1 | 4/2015 | Kwan et al. |
| 2015/0090571 A1 | 4/2015 | Leong et al. |
| 2015/0227207 A1 | 8/2015 | Winter et al. |
| 2015/0243457 A1 | 8/2015 | Niu et al. |
| 2015/0270073 A1 | 9/2015 | Yarak, III et al. |
| 2015/0277559 A1 | 10/2015 | Vescovi et al. |
| 2015/0287553 A1 | 10/2015 | Welch et al. |
| 2015/0309538 A1 | 10/2015 | Zhang |
| 2015/0332874 A1 | 11/2015 | Brock et al. |
| 2015/0348726 A1 | 12/2015 | Hendren |
| 2015/0378391 A1 | 12/2015 | Huitema et al. |
| 2016/0049266 A1 | 2/2016 | Stringer et al. |
| 2016/0172129 A1 | 6/2016 | Zercoe et al. |
| 2016/0189890 A1 | 6/2016 | Leong et al. |
| 2016/0189891 A1 | 6/2016 | Zercoe et al. |
| 2016/0259375 A1 | 9/2016 | Andre et al. |
| 2016/0329166 A1 | 11/2016 | Hou et al. |
| 2016/0336124 A1 | 11/2016 | Leong et al. |
| 2016/0336127 A1 | 11/2016 | Leong et al. |
| 2016/0336128 A1 | 11/2016 | Leong et al. |
| 2016/0343523 A1 | 11/2016 | Hendren et al. |
| 2016/0351360 A1 | 12/2016 | Knopf et al. |
| 2016/0365204 A1 | 12/2016 | Cao et al. |
| 2016/0378234 A1 | 12/2016 | Ligtenberg et al. |
| 2016/0379775 A1 | 12/2016 | Leong et al. |
| 2017/0004937 A1 | 1/2017 | Leong et al. |
| 2017/0004939 A1 | 1/2017 | Kwan et al. |
| 2017/0011869 A1 | 1/2017 | Knopf et al. |
| 2017/0090106 A1 | 3/2017 | Cao et al. |
| 2017/0301487 A1 | 10/2017 | Leong et al. |
| 2017/0315624 A1 | 11/2017 | Leong et al. |
| 2018/0029339 A1 | 2/2018 | Liu et al. |
| 2018/0040441 A1 | 2/2018 | Wu et al. |
| 2018/0074694 A1 | 3/2018 | Lehmann et al. |

FOREIGN PATENT DOCUMENTS

| | | |
|---|---|---|
| CN | 1533128 | 9/2004 |
| CN | 1542497 | 11/2004 |
| CN | 2672832 | 1/2005 |
| CN | 1624842 | 6/2005 |
| CN | 1812030 | 8/2006 |
| CN | 1838036 | 9/2006 |
| CN | 1855332 | 11/2006 |
| CN | 101051569 | 10/2007 |
| CN | 200961844 | 10/2007 |
| CN | 200986871 | 12/2007 |
| CN | 101146137 | 3/2008 |
| CN | 201054315 | 4/2008 |
| CN | 201084602 | 7/2008 |
| CN | 201123174 | 9/2008 |
| CN | 201149829 | 11/2008 |
| CN | 101315841 | 12/2008 |
| CN | 201210457 | 3/2009 |
| CN | 101438228 | 5/2009 |
| CN | 101465226 | 6/2009 |
| CN | 101494130 | 7/2009 |
| CN | 101502082 | 8/2009 |
| CN | 201298481 | 8/2009 |
| CN | 101546667 | 9/2009 |
| CN | 101572195 | 11/2009 |
| CN | 101800281 | 8/2010 |
| CN | 101807482 | 8/2010 |
| CN | 101868773 | 10/2010 |
| CN | 201655616 | 11/2010 |
| CN | 102110542 | 6/2011 |
| CN | 102119430 | 7/2011 |
| CN | 201904256 | 7/2011 |
| CN | 102163084 | 8/2011 |
| CN | 201927524 | 8/2011 |
| CN | 201945951 | 8/2011 |
| CN | 201945952 | 8/2011 |
| CN | 201956238 | 8/2011 |
| CN | 102197452 | 9/2011 |
| CN | 202008941 | 10/2011 |
| CN | 202040690 | 11/2011 |
| CN | 102280292 | 12/2011 |
| CN | 102338348 | 2/2012 |
| CN | 102375550 | 3/2012 |
| CN | 202205161 | 4/2012 |
| CN | 102496509 | 6/2012 |
| CN | 10269527 | 8/2012 |
| CN | 102622089 | 8/2012 |
| CN | 102629526 | 8/2012 |
| CN | 202372927 | 8/2012 |
| CN | 102679239 | 9/2012 |
| CN | 102683072 | 9/2012 |
| CN | 202434387 | 9/2012 |
| CN | 202523007 | 11/2012 |
| CN | 102832068 | 12/2012 |
| CN | 102955573 | 3/2013 |
| CN | 102956386 | 3/2013 |
| CN | 102969183 | 3/2013 |
| CN | 103000417 | 3/2013 |
| CN | 103165327 | 6/2013 |
| CN | 103180979 | 6/2013 |
| CN | 203012648 | 6/2013 |
| CN | 203135988 | 8/2013 |
| CN | 103377841 | 10/2013 |
| CN | 103489986 | 1/2014 |
| CN | 203414880 | 1/2014 |
| CN | 103681056 | 3/2014 |
| CN | 103699181 | 4/2014 |
| CN | 203520312 | 4/2014 |
| CN | 203588895 | 5/2014 |
| CN | 103839715 | 6/2014 |
| CN | 103839720 | 6/2014 |
| CN | 103839722 | 6/2014 |
| CN | 103903891 | 7/2014 |
| CN | 103956290 | 7/2014 |

(56) References Cited

FOREIGN PATENT DOCUMENTS

| | | |
|---|---|---|
| CN | 203733685 | 7/2014 |
| CN | 104021968 | 9/2014 |
| CN | 204102769 | 1/2015 |
| CN | 204117915 | 1/2015 |
| CN | 104517769 | 4/2015 |
| CN | 204632641 | 9/2015 |
| CN | 105097341 | 11/2015 |
| DE | 2530176 | 1/1977 |
| DE | 3002772 | 7/1981 |
| DE | 29704100 | 4/1997 |
| DE | 202008001970 | 8/2008 |
| EP | 0441993 | 8/1991 |
| EP | 1835272 | 9/2007 |
| EP | 1928008 | 6/2008 |
| EP | 2022606 | 6/2010 |
| EP | 2426688 | 3/2012 |
| EP | 2439760 | 4/2012 |
| EP | 2463798 | 6/2012 |
| EP | 2664979 | 11/2013 |
| FR | 2147420 | 3/1973 |
| FR | 2911000 | 7/2008 |
| FR | 2950193 | 3/2011 |
| GB | 1361459 | 7/1974 |
| JP | S50115562 | 9/1975 |
| JP | S60055477 | 3/1985 |
| JP | S61172422 | 10/1986 |
| JP | S62072429 | 4/1987 |
| JP | S63182024 | 11/1988 |
| JP | H0422024 | 4/1992 |
| JP | H0520963 | 1/1993 |
| JP | H0524512 | 8/1993 |
| JP | H05342944 | 12/1993 |
| JP | H09204148 | 8/1997 |
| JP | H10312726 | 11/1998 |
| JP | H11194882 | 7/1999 |
| JP | 2000010709 | 1/2000 |
| JP | 2000057871 | 2/2000 |
| JP | 2000339097 | 12/2000 |
| JP | 2001100889 | 4/2001 |
| JP | 2003114751 | 9/2001 |
| JP | 2002260478 | 9/2002 |
| JP | 2002298689 | 10/2002 |
| JP | 2003522998 | 7/2003 |
| JP | 2005108041 | 4/2005 |
| JP | 2006164929 | 6/2006 |
| JP | 2006185906 | 7/2006 |
| JP | 2006521664 | 9/2006 |
| JP | 2006269439 | 10/2006 |
| JP | 2006277013 | 10/2006 |
| JP | 2006344609 | 12/2006 |
| JP | 2007115633 | 5/2007 |
| JP | 2007514247 | 5/2007 |
| JP | 2007156983 | 6/2007 |
| JP | 2008021428 | 1/2008 |
| JP | 2008041431 | 2/2008 |
| JP | 2008100129 | 5/2008 |
| JP | 2008191850 | 8/2008 |
| JP | 2008533559 | 8/2008 |
| JP | 2008293922 | 12/2008 |
| JP | 2009099503 | 5/2009 |
| JP | 2009181894 | 8/2009 |
| JP | 2010061956 | 3/2010 |
| JP | 2010244088 | 10/2010 |
| JP | 2010244302 | 10/2010 |
| JP | 2011018484 | 1/2011 |
| JP | 2011065126 | 3/2011 |
| JP | 2011150804 | 8/2011 |
| JP | 2011165630 | 8/2011 |
| JP | 2011524066 | 8/2011 |
| JP | 2011187297 | 9/2011 |
| JP | 2012022473 | 2/2012 |
| JP | 2012043705 | 3/2012 |
| JP | 2012063630 | 3/2012 |
| JP | 2012098873 | 5/2012 |
| JP | 2012134064 | 7/2012 |
| JP | 2012186067 | 9/2012 |
| JP | 2012230256 | 11/2012 |
| JP | 2014017179 | 1/2014 |
| JP | 2014026807 | 2/2014 |
| JP | 2014216190 | 11/2014 |
| JP | 2014220039 | 11/2014 |
| JP | 2016053778 | 4/2016 |
| KR | 1019990007394 | 1/1999 |
| KR | 1020020001668 | 1/2002 |
| KR | 100454203 | 10/2004 |
| KR | 1020060083032 | 7/2006 |
| KR | 1020080064116 | 7/2008 |
| KR | 1020080066164 | 7/2008 |
| KR | 2020110006385 | 6/2011 |
| KR | 1020120062797 | 6/2012 |
| KR | 1020130040131 | 4/2013 |
| KR | 20150024201 | 3/2015 |
| TW | 200703396 | 1/2007 |
| TW | M334397 | 6/2008 |
| TW | 201108284 | 3/2011 |
| TW | 201108286 | 3/2011 |
| TW | M407429 | 7/2011 |
| TW | 201246251 | 11/2012 |
| TW | 201403646 | 1/2014 |
| WO | WO9744946 | 11/1997 |
| WO | WO2005/057320 | 6/2005 |
| WO | WO2006/022313 | 3/2006 |
| WO | WO2007/049253 | 5/2007 |
| WO | WO2008/045833 | 4/2008 |
| WO | WO2009/005026 | 1/2009 |
| WO | WO2012/011282 | 1/2012 |
| WO | WO2012/027978 | 3/2012 |
| WO | WO2013/096478 | 6/2013 |
| WO | WO2014175446 | 10/2014 |

OTHER PUBLICATIONS

U.S. Appl. No. 14/472,260, filed Aug. 28, 2014, pending.
U.S. Appl. No. 14/501,680, filed Sep. 30, 2014, pending.
U.S. Appl. No. 14/736,151, filed Jun. 10, 2015, pending.
U.S. Appl. No. 14/765,145, filed Jul. 31, 2015, pending.
U.S. Appl. No. 14/826,590, filed Aug. 14, 2015, pending.
U.S. Appl. No. 14/867,598, filed Sep. 28, 2015, pending.
U.S. Appl. No. 14/867,672, filed Sep. 28, 2015, pending.
U.S. Appl. No. 14/867,712, filed Sep. 28, 2015, pending.

* cited by examiner

LIGHT-EMITTING ASSEMBLY FOR KEYBOARD

CROSS-REFERENCE TO RELATED APPLICATIONS

This application is a non-provisional patent application of and claims the benefit to U.S. Provisional Patent Application No. 62/058,081, filed Sep. 30, 2014, and titled "Keyboard Assembly," U.S. Provisional Patent Application No. 62/129, 843, filed Mar. 7, 2015, and titled "Light Assembly for Keyboard Assembly," U.S. Provisional Patent Application No. 62/058,074, filed Sep. 30, 2014, and titled "Keyboard Assembly," U.S. Provisional Patent Application No. 62/129, 841, filed Mar. 7, 2015, and titled "Key for Keyboard Assembly," U.S. Provisional Patent Application No. 62/058, 067, filed Sep. 30, 2014 and titled "Keyboard Assembly," U.S. Provisional Patent Application No. 62/129,840, filed Mar. 7, 2015, and titled "Dome Switch for Keyboard Assembly," U.S. Provisional Patent Application No. 62/058,087, filed Sep. 30, 2014, and titled "Keyboard Assembly," and U.S. Provisional Patent Application No. 62/129,842, filed Mar. 7, 2015, and titled "Venting System for Keyboard Assembly," the disclosures of which are hereby incorporated herein by reference in their entirety.

FIELD

The disclosure relates generally to a keyboard assembly for an electronic device and, more particularly, to a light-emitting assembly positioned within a switch housing of a keyboard assembly for an electronic device.

BACKGROUND

Electronic devices typically include one or more input devices such as keyboards, touch pads, mice, touch screens, and the like to enable a user to interact with the device. These devices can be integrated into an electronic device or can stand alone. An input device can transmit signals to another device via a wired or wireless connection. For example, a keyboard can be integrated into the casing (e.g., housing) of a laptop computer. Touch pads and other input devices may likewise be integrated into associated electronic devices.

It may be useful to illuminate an input surface or structure when the associated electronic device is used in a dimly lit or dark environment. Specifically, conventional keyboards typically illuminate a perimeter and/or a glyph located on each keycap of the keyboard to aid in the visibility of the keyboard in low-light settings. However, in order to light the keyboard, conventional keyboards often include a variety of components including a group of lights, typically positioned on one or more light strips, a light guide panel for directing the light, and/or a reflective surface for redirecting stray light and enhancing the illumination of the lights.

The variety of components may require additional space within the enclosure housing the keyboard, which may be counter to a desire to decrease the size of the keyboard. Additionally, the light strip may be a fraction of the size of the entire keyboard and may include fewer lights than the total number of keycaps in the keyboard. As a result, the light strip may unevenly illuminate the keyboard. Finally, because of the number of components and/or the configuration of the components used to illuminate a conventional keyboard, an undesirable amount of heat may be generated within the keyboard and/or electronic device.

SUMMARY

A light-emitting assembly for a keyboard assembly is disclosed herein. The light-emitting assembly comprises a phosphor structure, a transparent material positioned on opposing side surfaces of the phosphor structure, and an epoxy layer positioned over an entire back surface of the phosphor structure and the transparent material. The light-emitting assembly also comprises a mask layer positioned over an entire top surface of: the phosphor structure, the transparent material, and the epoxy layer. The light-emitting assembly further comprises a light source positioned within the phosphor structure for emitting a light.

A keyboard assembly may comprise a switch housing formed from a substantially transparent material. The switch housing comprises a switch opening and a light source recess positioned adjacent the switch opening. The keyboard assembly also comprises a keycap positioned above the switch housing and a light-emitting assembly positioned within the light source recess of the switch housing. Additionally, the light-emitting assembly comprises a phosphor structure, a transparent material positioned on opposing side surfaces of the phosphor structure, a mask layer positioned over an entire top surface of the phosphor structure, and the transparent material. The light-emitting assembly also comprises a light source positioned within the phosphor structure for emitting a light through the switch housing.

Embodiments may take the form of a keyboard assembly comprising a keycap, a light source operably connected to the keycap and configured to illuminate the keycap, and a light source housing at least partially surrounding the light source. The light source housing is operative to block light from emanating out of the light source housing in a first direction and a second direction. The light source housing is also operative to pass light emanating in a third direction opposite the first direction, and the second direction is toward the keycap, as measured from the light source.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to a keyboard assembly for an electronic device and, more particularly, to a light-emitting structure positioned within a switch housing of a keyboard assembly for an electronic device. The light-emitting structure may be a light-emitting assembly formed from a number of different elements.

In a particular embodiment, the light-emitting assembly may be formed from a light source positioned within a phosphor structure adjacent, touching, or at least partially surrounded by various layers or materials, including: sidewalls (which may be formed from a transparent material or opaque material); epoxy (which may form a sidewall and may be either opaque or transparent); a mask layer; and/or a heat dissipation layer. The light-emitting assembly generates and/or transmits light in certain directions, such as through one or more of the phosphor structure and layers. The various layers may restrict light to traveling through only three sides of the assembly, in certain embodiments.

Light exiting the light-emitting assembly generally has a common wavelength and thus common color. Where the wavelengths and colors of light traveling through all light-transmissible sides of the assembly are equal, that light may illuminate an input surface such as a keycap. Accordingly, the keycap is substantially uniformly illuminated and has reduced or no dim spots and/or color shifts. Additionally, because of the configuration of the various layers and materials forming the light-emitting assembly, the light-emitting assembly may be a parallelepiped and compact, thereby reducing the space occupied within the keyboard assembly. Finally, where each key of the keyboard assembly includes an individual light-emitting assembly, keys and/or keycaps may be illuminated individually or selectively.

These and other embodiments are discussed below with reference to FIGS. 1-7. However, those skilled in the art will readily appreciate that the detailed description given herein with respect to these Figures is for explanatory purposes only and should not be construed as limiting.

Figure 1:
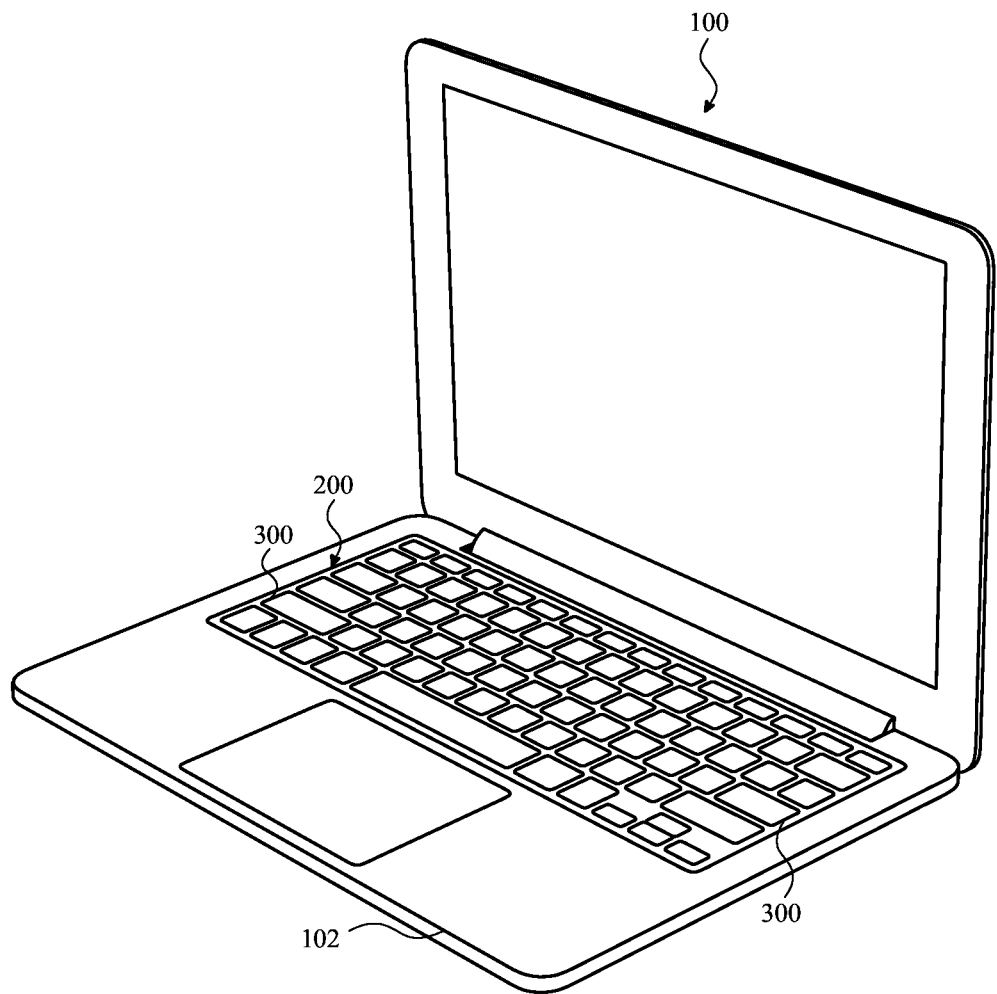
FIG. 1 shows an electronic device including a low-travel keyboard assembly, according to embodiments.

FIG. 1 shows an electronic device 100 including a low-travel keyboard assembly 200 that may incorporate a light-emitting assembly for illuminating keyboard assembly 200, as described in more detail below with respect to FIGS. 2-4. In a non-limiting example, as shown in FIG. 1, electronic device 100 may be a laptop computer. However, it is understood that electronic device 100 may be configured as any suitable electronic device that may utilize low-travel keyboard assembly 200. Other embodiments can implement electronic device 100 differently, such as, for example, a desktop computer, a tablet computing device, a telephone, a gaming device, a display, a digital music player, a wearable computing device or display, a health monitoring device, and so on.

Electronic device 100 may include a top case 102. Top case 102 may take the form of an exterior, protective casing or shell for electronic device 100 and the various internal components (for example, low-travel keyboard assembly 200) of electronic device 100. Top case 102 may be formed as a single, integral component, or may have a group of distinct components that may be configured to be coupled to one another, as discussed herein. Additionally, top case 102 may be formed from any suitable material(s) that provides a protective casing or shell for electronic device 100 and the various components included in electronic device 100. In non-limiting examples, top case 102 may be made from metal, a ceramic, a rigid plastic or another polymer, a fiber-matrix composite, and so on.

Low-travel keyboard assembly 200 may be included within electronic device 100 to allow a user to interact with electronic device 100. As shown in FIG. 1, low-travel keyboard assembly 200 is positioned within and/or may be received by top case 102 of electronic device 100. Low-travel keyboard assembly 200 may include a set of keycaps 300 positioned within and partially protruding through and/or surrounded by top case 102 of electronic device 100. As discussed herein, keycaps 300 are depressed and displaced to at least partially collapse a dome switch of low-travel keyboard assembly 200, which in turn forms an electrical signal or input to electronic device 100.

As discussed herein, keycap 300 of low-travel keyboard assembly 200 can be illuminated by a light-emitting assembly. The light-emitting assembly of low-travel keyboard assembly 200 is positioned in a switch housing surrounding a dome switch, where the switch housing and dome switch are positioned below keycap 300. That is, each individual keycap 300 includes an individual switch housing, which includes an individual light-emitting assembly positioned therein. As a result, a single light-emitting assembly illuminates each corresponding keycap 300. This can improve brightness and light uniformity for each keycap, and between keycaps.

Additionally, because each keycap 300 is illuminated by a single, corresponding light-emitting assembly, keycaps 300 of keyboard assembly 200 can be illuminated individually or selectively. In some embodiments, other illumination schemes may be used. For example, adjacent of keys can be lit by a single light-emitting assembly (e.g., one light-emitting assembly for each group of keys). In other embodiments, a row or column of keys may be illuminated by a single light-emitting assembly. In still other embodiments, light source assemblies may be located at different points under a keyboard so that a relatively small number of assemblies may illuminate an entire keyboard (or all keycaps of the keyboard). In any or all embodiments, light source assemblies may be located within or outside of switch housings, under keycaps, or under portions of the casing. Further, light source assemblies described herein may be used with other input devices, including mice, track pads, buttons, switches, touch-sensitive and/or force-sensitive surfaces, and so on.

The light source assemblies of low-travel keyboard assembly 200 are formed from a light source positioned within a phosphor structure surrounded by various layers or materials that may include one or more transparent materials, one or more epoxy layers and one or more mask layers. The various layers to allow light to be emitted from only three sides of the assembly. Further, the emitted light has identical wavelengths and color. Where the wavelengths and visible light color are identical on all sides of the assembly, keycap 300 of low-travel keyboard assembly 200 is illuminated by the light-emitting assembly with a consistent visible light color and does not have discrepancies in illuminating light color or intensity.

Additionally, and as discussed herein, because of the configuration of the various layers and materials forming the light-emitting assembly, the light-emitting assembly can be a parallelepiped. The parallelepiped shape of the light-emitting assembly of low-travel keyboard assembly may reduce the overall size of light-emitting assembly and/or makes light-emitting assembly substantially compact. With a reduced size, the required amount of space occupied by light-emitting assembly within keyboard assembly 200 may also be reduced. This ultimately allows for low-travel keyboard assembly 200 and/or electronic device 100 to have a reduced size as well. It should be appreciated that substantially any other geometric or non-geometric three-dimensional shape may also be used for a light-emitting assembly.

In the non-limiting example shown in FIG. 1, where electronic device 100 is a laptop computer, low-travel keyboard assembly 200 may be positioned within and/or may be received by electronic device 100. In an additional embodiment, low-travel keyboard assembly 200 may be a distinct, standalone component and may be in electronic communication, whether wired or wireless, with electronic device 100. Low-travel keyboard assembly 200 may be configured to allow a user to interact with electronic device 100.

Figure 2:
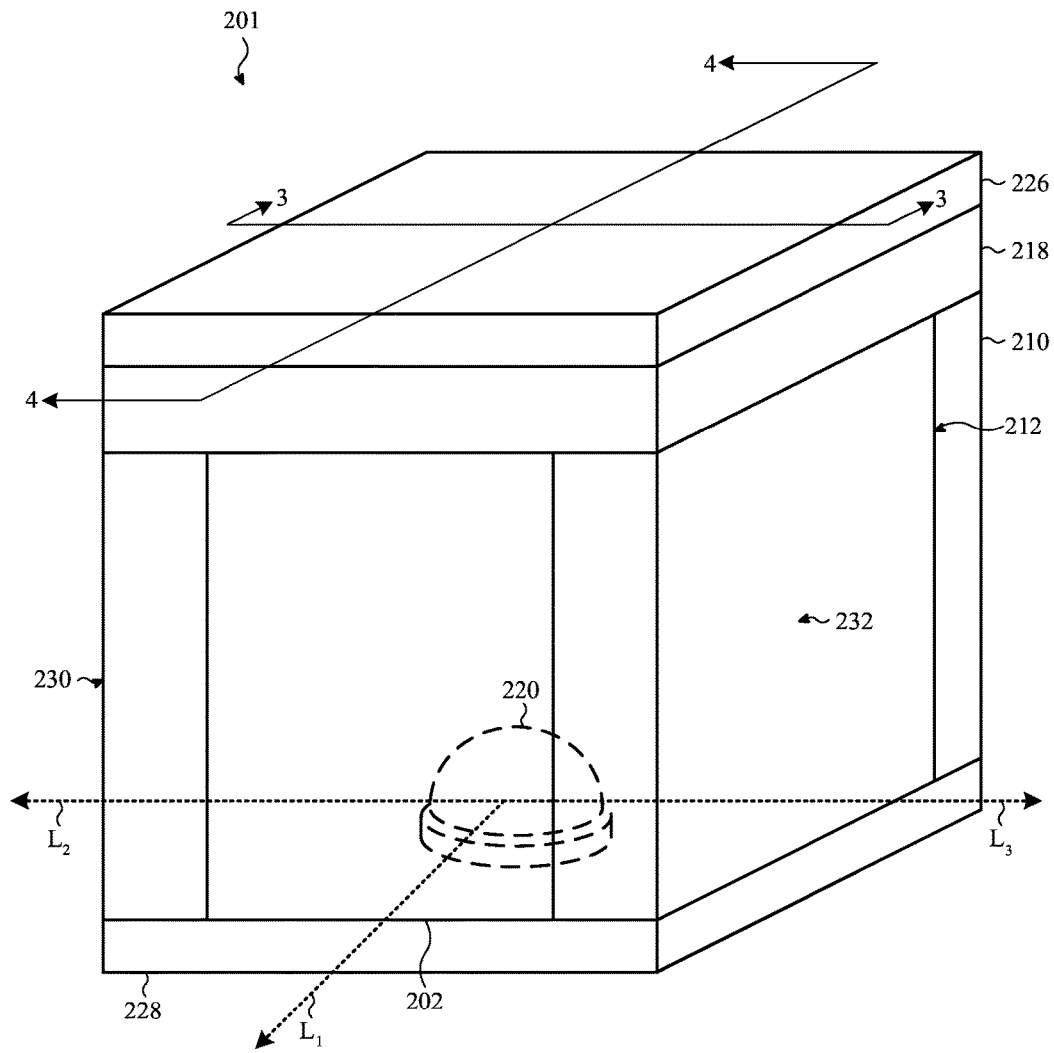
FIG. 2 shows a light-emitting assembly of a low-travel keyboard assembly, according to embodiments.

FIG. 2 shows a light-emitting assembly 201 of low-travel keyboard assembly 200 (see, FIGS. 1 and 5-7). Light-emitting assembly 201 may emit a light that travels from the assembly, into a switch housing, and is redirected by the switch housing to illuminate keycap 300. With the spatial constraints of light source recess 404 of switch housing 400 (see, FIGS. 5-7), discussed herein, light-emitting assembly 201 may be configured to fit in light source recess 404 and provide light to keycap 300, including during operation of low-travel keyboard assembly 200.

Light-emitting assembly may have a phosphor structure 202 and transparent material 204 positioned on opposing sides surfaces of phosphor structure 202. In some embodiments, the transparent material may be positioned on or otherwise abutting the phosphor material, either wholly or partially. The phosphor structure may be a phosphor-doped material and may overlay a light source 220. In some embodiments, the phosphor structure may alter a wavelength of a light emitted by the light source, thereby altering its color. Further, in some embodiments the phosphor structure may luminesce (e.g., emit light) when the light source is active. Thus, the phosphor structure may be a luminescent structure. As discussed herein, phosphor structure 202 and transparent material 204 may allow light from a light source of light-emitting assembly 201 to be emitted through the respective portions.

The transparent material 204 may permit light to travel therethrough. Any suitable material may be used as the transparent material, including various plastics, polymers, ceramics, glasses, and so on.

Light source 220 of light-emitting assembly 201 may be positioned within phosphor structure 202. As shown in the cross-sectional views of FIGS. 3 and 4, light source 220 may be positioned substantially in the center of, and substantially encompassed within, phosphor structure 202 of light-emitting assembly 201. Light source 220 may emit a light through phosphor structure 202 and transparent material 204 and, ultimately, through switch housing 400 of low-travel keyboard assembly 200, as discussed herein with respect to FIGS. 5-7. In some embodiments, the light source 220 may be off-center with respect to the phosphor structure 202 and/or light-emitting assembly 201.

A variety of different light sources 220 may be used in the light-emitting assembly 201. For example, the light source 220 may be a light-emitting diode, an organic light-emitting diode, a quantum dot, a cold cathode fluorescent lamp, and so on. Further, the light source may emit multiple colors of light in some embodiments. As an example, the light source may be a multicolor LED and the color emitted by the LED may change based on a user input, operating state, software or firmware command, and so on. Some embodiments may also employ multiple light sources 220 in a single light-emitting assembly 201.

Light-emitting assembly 201 may also have an epoxy layer 210 placed over an entire back surface 212 of phosphor structure 202 and transparent material 204. In one embodiment, epoxy layer 210 may be substantially larger in one or more dimension than phosphor structure 202 and transparent material 204, although this may vary between embodiments. More specifically, as shown in FIG. 2, epoxy layer 210 may be substantially wider than phosphor structure 202 and transparent material 204 an example of this is shown in FIG. 4.

Returning to FIG. 2, epoxy layer 210 may be adjacent or abutting back surface 212 of phosphor structure 202 and transparent material 204, which may substantially waterproof light-emitting assembly 201 and its components. In non-limiting examples, epoxy layer 210 may be substantially transparent to allow light from light source 220 to pass through epoxy layer 210. Alternatively, epoxy layer 210 may be opaque epoxy and prevent light from passing through epoxy layer 210. In some embodiments, the transparent material 204 may be formed on the phosphor structure; likewise in some embodiments the epoxy may be directly formed on the back surface (e.g., rear). In other embodiments, the transparent material and/or epoxy layer may be deposited or layered, rather than formed, on their corresponding surfaces.

Light-emitting assembly 201 may also incorporate a mask layer 218. Mask layer 218 may be positioned over phosphor structure 202, transparent material 204 and/or epoxy layer 210 of light-emitting assembly 201. In a non-limiting example shown in FIG. 2, phosphor structure 202, transparent material 204 and epoxy layer 210 of light-emitting assembly 201 may have top surfaces that may be in planar alignment and may be substantially covered by mask layer 218. Mask layer 218 may be formed from an opaque material to prevent light of light source 220 from being emitted through mask layer 218.

Figure 3:
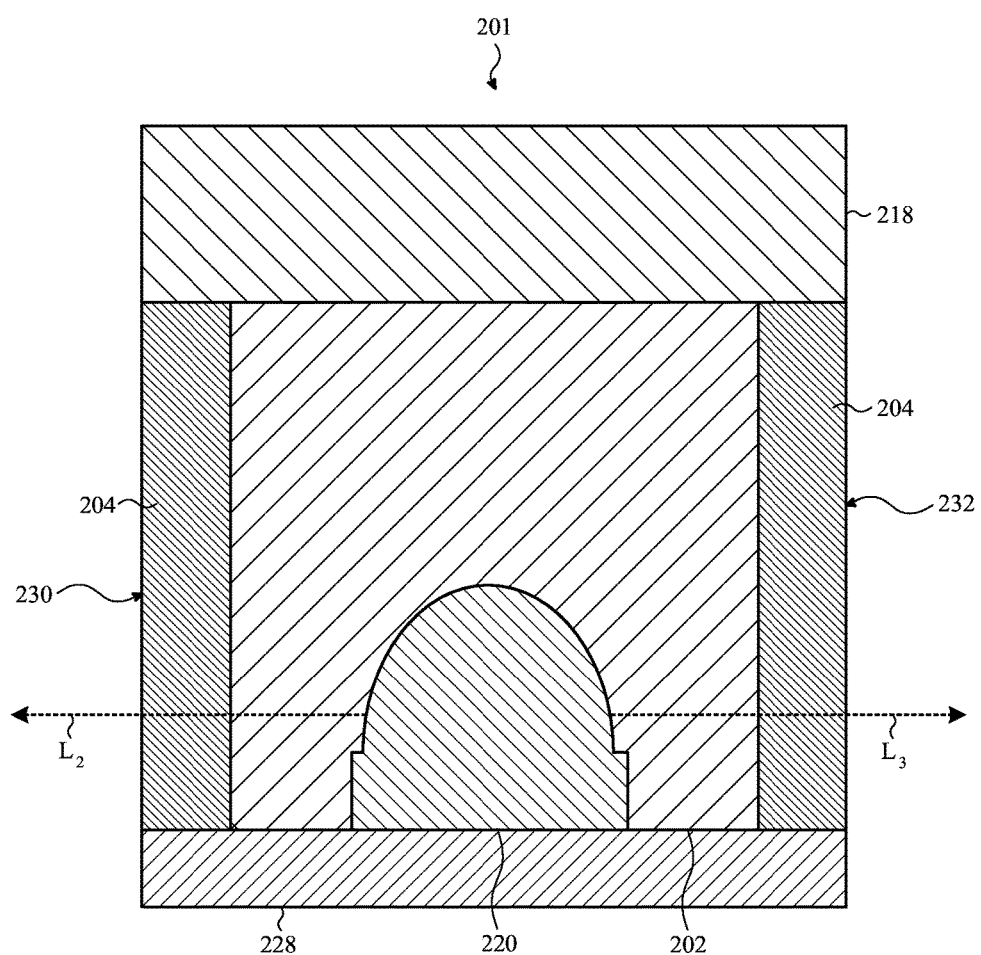
FIG. 3 shows a cross-sectional front view of the LED assembly taken along line 3-3 in FIG. 2, according to embodiments.
Figure 4:
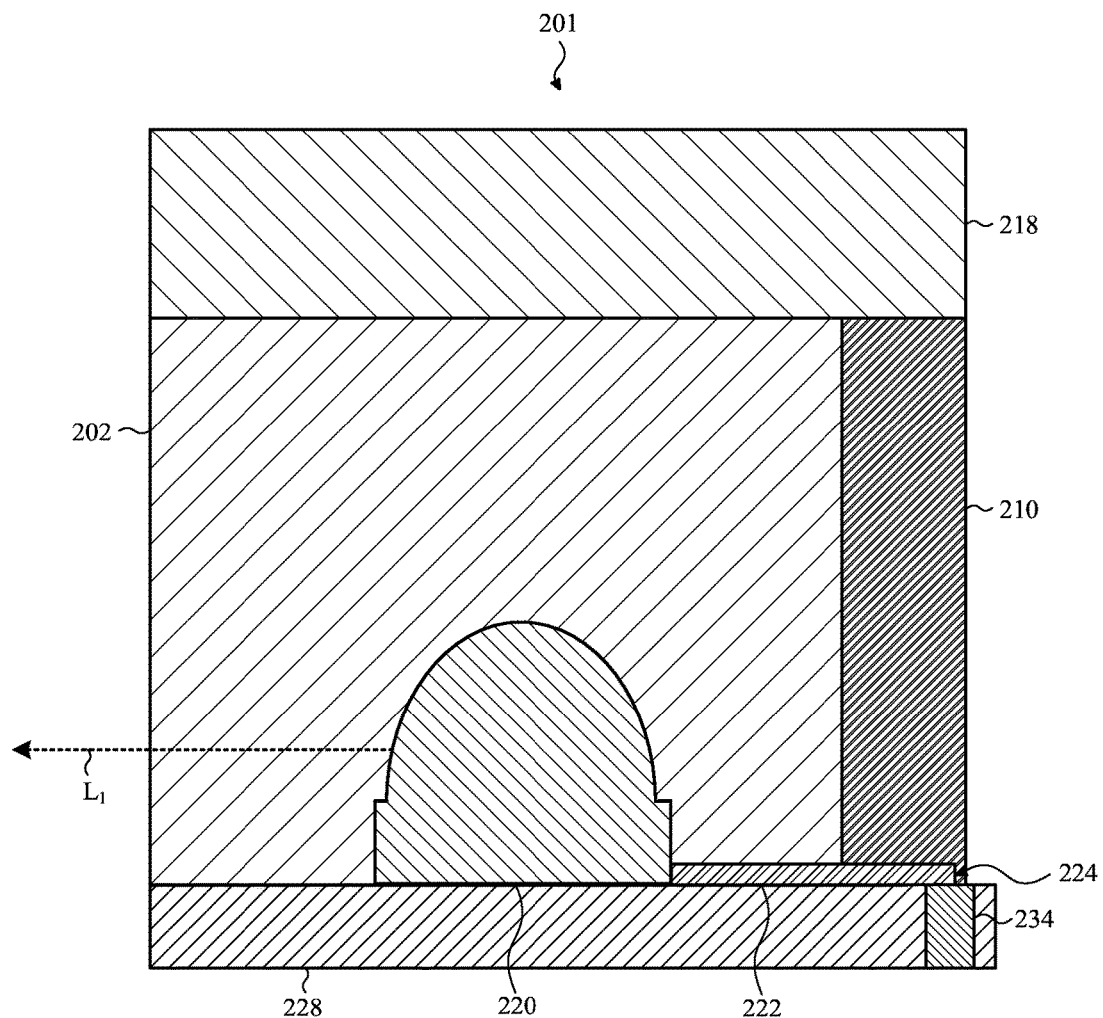
FIG. 4 shows a cross-sectional side view of the LED assembly taken along line 4-4 in FIG. 2, according to embodiments.

With continued reference to FIG. 2, FIGS. 3 and 4 show cross-section views of LED assembly 201. Specifically, FIG. 3 shows a cross-sectional front view of LED assembly 201 taken along line 3-3 in FIG. 2, and FIG. 4 shows a cross-sectional side view of LED assembly 201 taken along line 4-4 in FIG. 2. As shown in FIG. 4, light source 220 may have one or more electrical leads 222 electrically coupled to light source 220 and a substrate 228, such as a printed circuit board (PCB) 500 of low travel keyboard assembly 200 (see, FIGS. 5-7), to provide power to light source 220. In the non-limiting example shown in FIGS. 2-4, the electrical leads 222 electrically couple light source 220 to substrate 228, such that substrate 228 may provide power to light source 220, as discussed herein. As shown in FIGS. 2 and 4, the electrical leads 222 may be positioned in phosphor structure 202 and may extend toward back surface 212 of phosphor structure 202. Portions of the leads 222 of light source 220 may also extend through or be positioned within epoxy layer 210, so that epoxy layer 210 seals (e.g., waterproofs) the electrical leads 222 and, ultimately, light source 220, to prevent light source 220 from undesirably shorting due to moisture exposure. As shown in FIG. 4, the portion of the electrical leads 222 placed and sealed within epoxy layer 210 may be an end portion 224 of leads 222, which may be electrically coupled to and/or in electronic communication with a light source contact 234 of substrate 228 for receiving power for light source 220.

Light-emitting assembly 201 may also have a heat dissipation layer 226 over mask layer 218. Heat dissipation layer 226 may be formed from a heat resistant material that may dissipate the heat generated by light source 220 and the light generated by light source 220. As light is emitted from light source 220, light may contact mask layer 218, but may not be emitted through opaque mask layer 218. However, the light and light source 220 may generate heat on or in mask layer 218. Heat dissipation layer 226 may be positioned on mask layer 218 to dissipate the heat exposed to mask layer 218, which in turn reduce or prevent chemical and/or physical changes to mask layer 218. In some embodiments, the mask layer and heat dissipation layer may be the same layer, or formed from the same material. For example, a thermally conductive mask layer may be used.

In some embodiments, the transparent material(s) 204, mask layer 218, heat dissipation layer 226, and/or epoxy layer 210 may be affixed to the phosphor structure 202. This may be accomplished by any or all of an additional element such as an adhesive or fastener, an inherent property of one or more parts of the light-emitting assembly 201, or the method of manufacture for the assembly. It should be appreciated that the various parts of the light-transmitting assembly 201 need not be affixed to one another. For example, they may be affixed to substrate 228 such as a printed circuit board 500 or to a switch housing 400 (see, FIGS. 5 and 6) instead.

FIGS. 2-4 show light rays, labeled $L_{1-3}$, emanating from light source 220. These rays are examples and are not intended to illustrate any limiting angle for emitted light. Rather, the light source 220 may emit light at any angle and direction, including out-of-plane with the illustrated light rays. Thus, for example, the light source may emit light in a hemispherical pattern, near-spherical pattern, conic pattern, and so on. Accordingly, the light rays are intended to show overall, sample directions of emitted light and particularly how light may pass through certain surfaces of the light-emitting assembly 201.

In one embodiment, light may be emitted through three sides of light-emitting assembly 201. In the non-limiting example shown in FIGS. 4-6, light ($L_1$) may be emitted through a front face of light-emitting assembly 201 including phosphor structure 202. Likewise light ($L_2$) may be emitted through a first sidewall 230 defined by transparent material 204. Additionally, light ($L_3$) may be emitted through a second sidewall 232 of light-emitting assembly 201 including transparent material 204. The second side surface 232 may be opposite first side surface 230. The first and second side surfaces may be sidewalls.

Light ($L_1$) emitted through the front face of light-emitting assembly 201 may have a wavelength substantially equal to a wavelength of light ($L_2$) emitted through first transparent sidewall 230 and a wavelength of light ($L_3$) emitted through second transparent sidewall 232. As a result of the wavelengths of light ($L_{1-3}$) being equal, the visible light color of the light ($L_{1-3}$) may also be identical or substantially the same. That is, the visible light color of the light ($L_1$) emitted through the front face of light-emitting assembly 201 may be substantially identical to a visible light color of light ($L_2$) emitted through first transparent sidewall 230 and a visible light color of light ($L_3$) emitted through second transparent sidewall 232.

As shown in FIGS. 2-4, light-emitting assembly 201 may be a parallelepiped, or substantially a parallelepiped. Further, phosphor structure 202 and transparent material 204 positioned on opposite sides of surfaces of phosphor structure 202 may be substantially parallelepiped-shaped. Other embodiments may employ light-emitting assemblies 201 of any suitable shape and/or size, including irregular shapes. Likewise, a shape of the phosphor structure 202 need not match a shape of the overall assembly.

Figure 5:
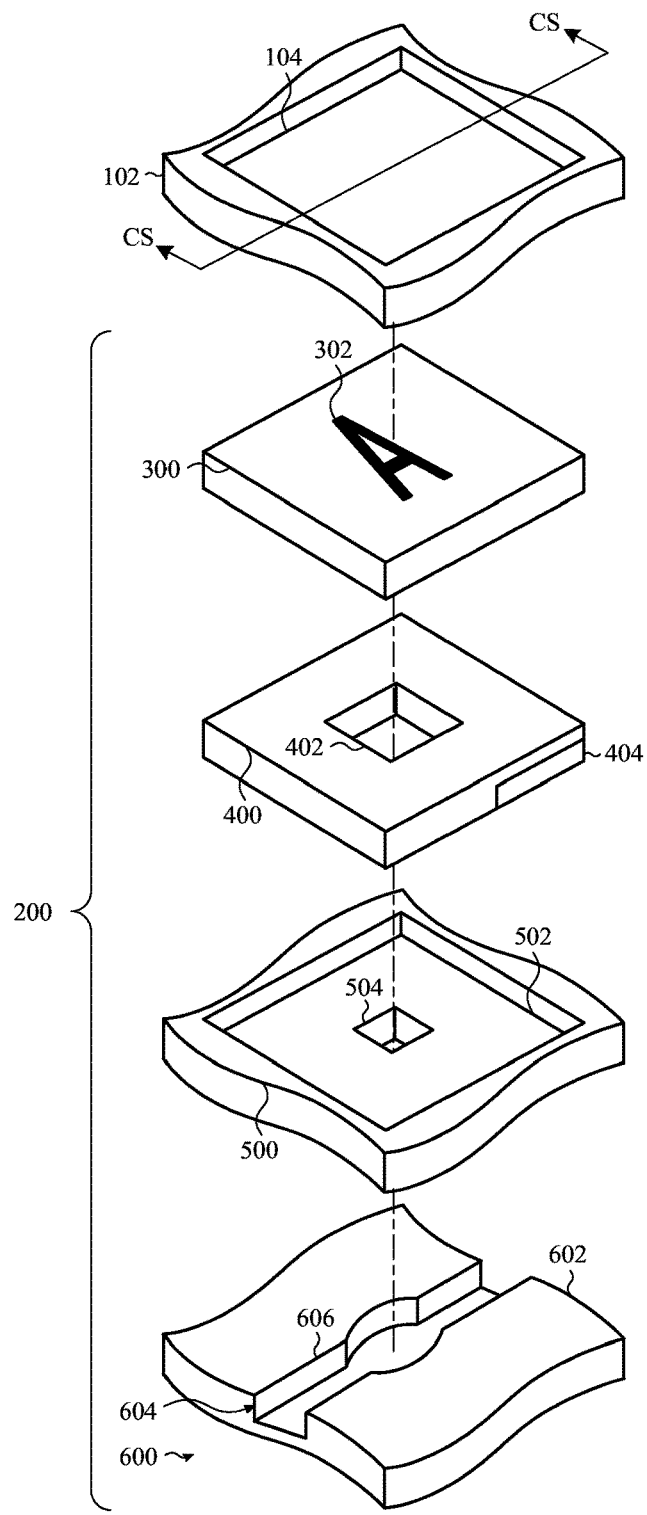
FIG. 5 shows an exploded view of a single key of the low-travel keyboard assembly of FIG. 2, according to embodiments.
Figure 6:
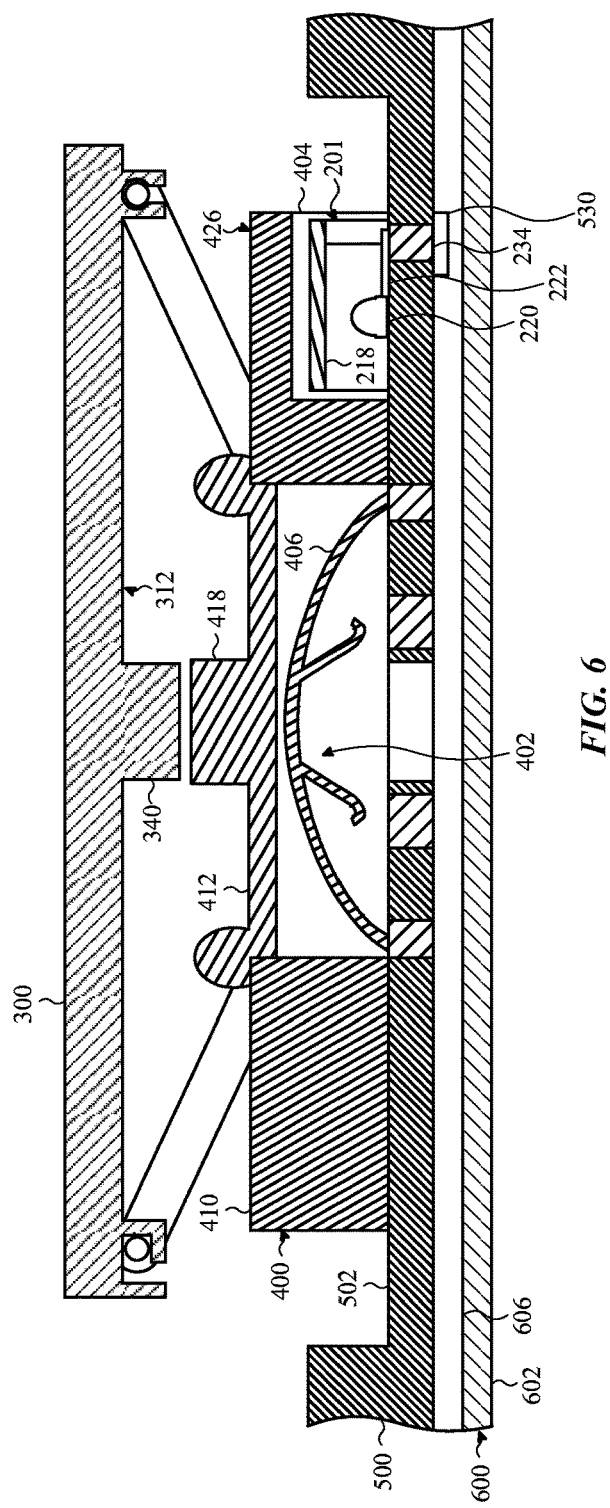
FIG. 6 shows a cross-section view of a low-travel keyboard assembly including a switch housing taken along line CS-CS in FIG. 5, according to embodiments.
Figure 7:
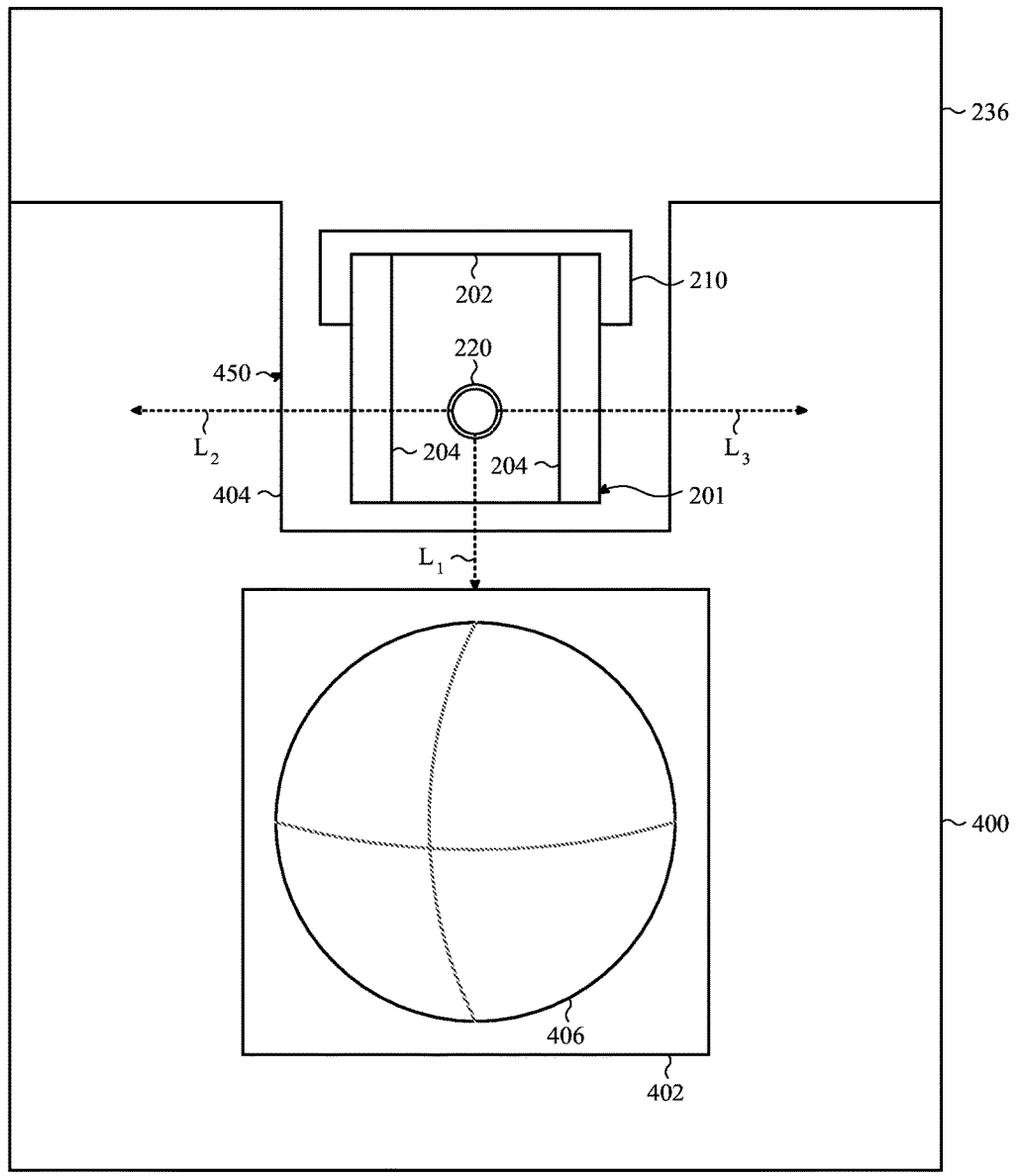
FIG. 7 shows a top view of a switch housing of a low-travel keyboard assembly including light-emitting assembly of FIGS. 2-4, according to embodiments.

As a result of its geometry, light-emitting assembly 201 may require less space in low-travel keyboard assembly 200, as discussed herein with respect to FIGS. 5-7. Further, the aforementioned transparent material may form one or more transparent sidewalls of the light-emitting assembly. For example and as shown in FIG. 2, opposing sidewalls may be formed from the transparent material. Similarly, a rear or back surface of the light-emitting assembly may be formed from epoxy or another suitable material, and may be opaque. A front face of the light-emitting assembly 201 may be formed by a front surface of the phosphor structure. A mask layer may overlay the phosphor structure and upper surfaces of the sidewalls, thereby defining a top of the assembly. As also shown in FIG. 2, the phosphor structure may abut the sidewalls and the opaque material forming the rear, although other embodiments may include spaces between any or all of the foregoing. Further and as shown in FIGS. 2-4, the phosphor structure may fill an interior of the light-emitting assembly, as defined by the sidewalls, rear, and mask layer.

Additionally, because of the geometric shape of light-emitting assembly 201 and the inclusion of transparent material 204 positioned on opposite sides of phosphor structure 202, the wavelength and, ultimately, the visible light color of the light emitted by light source 220 may be substantially identical on all sides of light-emitting assembly 201. That is, the greater the thickness of phosphor structure 202 in which light from light source 220 must travel through, the more the wavelength of the light will change. However, a wavelength of light from light-emitting assembly 201 may be tuned by adding or removing more transparent material 204. This may ensure that the wavelength of light ($L_1$) emitted through the front face, including front surface of phosphor structure 202, is equal to the wavelengths of the light ($L_2$, $L_3$) emitted through first sidewall and second sidewall including transparent material 204. And, as discussed herein, wherein the wavelengths of light emitted through light-emitting assembly 201 are equal, the visible light color of light emitted through light-emitting assembly 201 may also be identical or substantially the same, creating a uniform illumination color for keycap 300 of keyboard assembly 200 (see, FIGS. 5-7).

FIGS. 5 and 6 show a sample key structure of low-travel keyboard assembly 200 that utilizes light-emitting assembly 201 (see, FIG. 6), according to non-limiting examples. Specifically, FIG. 5 shows a detailed exploded view of a portion of top case 102 of electronic device 100 and a single key structure 502 that utilizes light-emitting assembly 201, as discussed herein. FIG. 6 shows a cross-section view of the single key assembly 502, taken along line CS-CS of FIG. 5. It is understood that similarly named components or similarly numbered components may function in a substantially similar fashion, may include similar materials and/or may include similar interactions with other components. Redundant explanation of these components has been omitted for clarity.

As shown in FIG. 5, top case 102 of electronic device 100 (see, FIG. 1) may include one or more keyholes 104 formed therethrough. Top case 102 may also include ribs or other supports 106 between or about the keycaps 300, and may substantially surround and/or may be positioned within the space between the keycaps 300 of low-travel keyboard assembly 200.

Low-travel keyboard assembly 200 may be made from a number of layers or components positioned adjacent to and/or coupled to one another. The components positioned in layers may be positioned adjacent to and/or coupled to one another, and may be sandwiched between top case 102 and a bottom case (not shown) of electronic device 100.

The keycaps 300 of low-travel keyboard assembly 200 may be positioned at least partially within keyholes 104 of top case 102. Each of the keycaps 300 may include a glyph 302 positioned on a top or exposed surface of the keycap 300. Each glyph 302 of keycap 300 may be substantially transparent to allow a light to be emitted through and/or illuminate keycap 300. In the non-limiting example shown in FIGS. 5 and 6, keycap 300 may be substantially opaque, except for glyph 302, which may be transparent to allow light to be emitted through keycap 300. Additionally, the perimeter of keycap 300 may be substantially illuminated by light emitted between the space between keycap 300 and skeletal ribs 106 of top case 102.

As shown in FIG. 6, keycap 300 of low-travel keyboard assembly 200 may include retaining members 304, 306 positioned on keycap 300. More specifically, keycap 300 may include at least one first retaining member 304 positioned on first side 308 and at least one second retaining member 306 positioned on a second side 310 of keycap 300, opposite first side 308. Retaining members 304, 306 may be formed, positioned, or retained on an underside 312 of keycap 300 adjacent a switch housing 400 of low-travel keyboard assembly 200. The retaining members 304, 306 may be utilized to couple keycap 300 within low-travel keyboard assembly 200 and, specifically, to couple keycap 300 to a hinge mechanism 322 coupled to PCB 500. Hinge mechanism 322, as shown in FIG. 6, may include any suitable hinge mechanism 322 capable of moving keycap 300 from an undepressed (e.g., rest) state to a depressed state, including, but not limited to, a butterfly hinge mechanism, a scissor hinge mechanism, a telescoping hinge mechanism or a sliding hinge mechanism. Hinge mechanism 322 may be coupled to and/or positioned within recess a 502 formed in PCB 500 of low-travel keyboard assembly 200.

The keycaps 300 may be positioned above corresponding switch housings 400 of low-travel keyboard assembly 200, and may interact with a corresponding switch housing 400. Each switch housing 400 of low-travel keyboard assembly 200 may include a switch opening 402 extending completely through switch housing 400, and a light source recess 404 formed within each switch housing 400. Some switch housings 400 may define multiple light source recesses 404, each of which may house its own light-emitting assembly 201 or multiple assemblies. Further, the light source recess 404 may be sized such that one or more of its interior walls engage the exterior of the light-emitting assembly 201, or gaps may exist between the interior walls of the light source recess and any or all parts of the light-emitting assembly's exterior.

As shown in FIG. 6, switch opening 402 may receive and/or house dome switch 406, which may be collapsed in response to keycap 300 translating. The dome switch collapses (or partially collapse) to generate an electrical connection acting as a signal to electronic device 100 (see, FIG. 1). Additionally, as shown in FIG. 6, light source recess 404 of switch housing 400 may receive light-emitting assembly 201, which may emit a light through switch housing 400 to provide a light around the perimeter of keycap 300 and/or through transparent glyph 302 (see, FIG. 5) of keycap 300. Additionally in another non-limiting example, light-emitting assembly 201 may emit light directly toward recess 502 to aid in illuminating the perimeter of keycap 300. Although discussed herein as a dome switch, it is understood that switch opening 402 may receive or house different types of switches.

As also shown in FIG. 6, switch housing 400 may include a body portion 410 and a top panel 412 formed integrally and molded to body portion 410. Body portion 410 of switch housing 400 may include switch opening 402 and light source recess 404 adjacent switch opening 402. Body portion 410 may be directly coupled to PCB 500, as shown in FIG. 6.

Body portion 410 and top panel 412 of switch housing 400 may be formed from distinct materials. That is, body portion 410 may be formed from a first material having substantially rigid properties for supporting keycap 300 during operation of low-travel keyboard assembly 200 and/or protecting the various components (e.g., dome switch 406, light-emitting assembly 201) included within switch housing 400. The first material forming body portion 410 of switch housing 400 may also be transparent and/or reflective to direct light out of the switch housing and toward the keycap 300. In a non-limiting example, light source 220 of light-emitting assembly 201 may emit light through transparent switch housing 400, and switch housing 400 may substantially reflect and/or allow light to be transmitted through the transparent material of switch housing 400 to illuminate glyph 302 on keycap 300 and/or the perimeter of keycap 300.

The top panel 412 may act as a light guide to direct light emitted from light-emitting assembly 201 to keycap 300. The top panel 412 may include structures configured to focus light on specific areas of the keycap or about the keycap, as well as reflective structures configured to direct light toward the keycap. For example, lenses, apertures, and the like may emit light from the top panel, while an upper surface of the top panel may reflect light incident on the panel.

Top panel 412 of switch housing 400 may be formed integrally with body portion 410. As one example, as shown in FIG. 6, top panel 412 may be overmolded on body portion 410 and may cover switch opening 402 of body portion 410. In a non-limiting example, top panel 412 may be formed integrally with body portion 410 using a double-shot housing formation process. Top panel 412 may be formed from a second material, distinct from the first material forming body portion 410, and may be substantially flexible/deformable. As discussed herein, top panel 412 may substantially flex and protect dome switch 406 when keycap 300 is depressed. In addition to being flexible, the second material forming top panel 412 may have substantially transparent properties that allow light to pass through top panel 412 to keycap 300 and/or substantially reflective properties to redirect light toward keycap 300.

Top panel 412 may be positioned over switch opening 402 not only to redirect light toward keycap 300 but also to substantially protect dome switch 406 from wear. That is, when a force is applied to keycap 300 to depress keycap 300, keycap 300 may contact top panel 412 of switch housing 400, which may subsequently deform and collapse dome switch 406 to form an electrical connection. By acting as a barrier between keycap 300 and dome switch 406, top panel 412 may reduce the wear on dome switch 406 over the operational life of low-travel keyboard assembly 200.

Top panel 412 may also include a first contact protrusion 418 positioned on a first surface 420 of the top panel 412. First contact protrusion 418 may be positioned directly adjacent a second contact protrusion 340 on underside 312 of keycap 300. The first contact protrusion 418 of top panel 412 and the second contact protrusion 340 of keycap 300 may contact one another when keycap 300 is depressed and may more evenly distribute the force applied to top panel 412 and, subsequently, dome switch 406 when keycap 300 is depressed. By distributing the force through top panel 412, the wear on dome switch 406 may be further reduced over the operational life of low-travel keyboard assembly 200.

Switch housing 400 may also include a roof portion 426 over light source recess 404. More specifically, body portion 410 of switch housing 400 may include a roof portion 426 positioned over light source recess 404 and light-emitting assembly positioned within light source recess 404. As shown in FIG. 6, roof portion 426 of switch housing 400 may be formed integrally with switch housing 400 and, specifically, body portion 410 of switch housing 400. However, it is understood that roof portion 426 of switch housing 400 may be formed from a distinct component or material that may be coupled to body portion 410 of switch housing 400. Roof portion 426 of switch housing 400 may be substantially opaque to prevent the light of light-emitting assembly 201 from being emitted through roof portion 426. In a non-limiting example, substantially opaque roof portion 426 may work in conjunction with mask layer 218 of light-emitting assembly 201, as discussed herein with respect to FIG. 4, to prevent light from passing directly toward keycap 300 and/or through roof portion 426 of switch housing 400.

Low-travel keyboard assembly 200 may also include a printed circuit board (PCB) 500 positioned below the group of switch housings 400. PCB 500 may be similar to substrate 228 discussed herein with respect to FIGS. 2-4. As shown in FIGS. 5 and 6, switch housings 400 may be coupled to PCB 500 of low-travel keyboard assembly 200. More specifically, PCB 500 may include a number of recesses 502 within PCB 500, where each recess 502 of PCB 500 may receive a corresponding switch housing 400 of low-travel keyboard assembly 200. Each switch housing 400 may be positioned completely within, and coupled to the surface of, recess 502 of PCB 500. PCB 500 may provide a rigid support structure for switch housing 400, and the various components forming low-travel keyboard assembly 200.

PCB 500 may also include one or more apertures 504 extending through each of the recesses 502. That is, aperture 504 may pass completely through PCB 500 in recess 502. As shown in FIGS. 5 and 6, aperture 504 of PCB 500 may be substantially aligned with switch opening 402 of switch housing 400 of low-travel keyboard assembly 200. The apertures 504 of PCB 500 may be utilized to receive a portion of the dome switch positioned within switch housing 400 when the dome switch collapses.

As shown in FIG. 6 and discussed herein with respect to FIGS. 2-4, light-emitting assembly 201 and, specifically, leads 222 of light source 220 may be in electrical contact with light source contact 234 extending from or through PCB 500. Light source contact 234 may be in communication with a light source driver 530 positioned on second surface 518 of PCB 500. PCB 500 may have a number of light source drivers 530 positioned on second surface 518, where each light source driver 530 corresponds to, and is in electronic communication with, light-emitting assembly 201 of low-travel keyboard assembly 200. light source drivers 530 positioned on second surface 518 of PCB 500 may be configured to provide power and/or control to light-emitting assembly 201 during operation of low-travel keyboard assembly 200 included in electronic device 100 (see, FIG. 1). It is understood that FIG. 6, showing a single key assembly, may represent some or all of the keys for low-travel keyboard assembly 200. Where each key assembly of low-travel keyboard assembly 200 is structured similar to the key assembly shown in FIG. 6, each switch housing 400 for each key of low-travel keyboard assembly 200 may have light-emitting assembly 201. As a result, each individual keycap 300 may be illuminated by the corresponding individual light-emitting assembly 201.

Low-travel keyboard assembly 200, as shown in FIGS. 5 and 6, may include a keyboard shield 600 positioned below PCB 500. Keyboard shield 600 may be formed from a conductive adhesive sheet 602 adhered to PCB 500 opposite switch housing 400. Conductive adhesive sheet 602 of shield 600 may include a venting system 604, which vents air expelled from switch housing 400 when dome switch 406 collapses, as discussed herein. As shown in FIGS. 5 and 6, venting system 604 may include a group of channels 606 formed within and/or partially through conductive adhesive sheet 602 of shield 600 which may be in fluid communication and/or may be substantially aligned with dome switch opening 402 formed in switch housing 400 and aperture 504 formed through PCB 500. Conductive adhesive sheet 602 of keyboard shield 600 may be utilized to transmit signals to and/or from keyboard assembly 200 of electronic device 100 during user interaction.

FIG. 7 shows a top view of switch housing 400 including light-emitting assembly 201. Roof portion 426 of switch housing 400 and mask layer 218 of light-emitting assembly 201 are omitted in FIG. 7 to clearly show light-emitting assembly 201 positioned within light source recess 404 of switch housing 400. As discussed herein with respect to FIGS. 2 and 6, roof portion 426 of switch housing 400 and mask layer 218 of light-emitting assembly 201 may prevent light from passing through roof portion 426, directly toward keycap 300. As shown in FIG. 7, light-emitting assembly 201 may be substantially surrounded by three sidewalls 450 of light source recess 404 of switch housing 400. In one example, light source recess 404 may be bounded by three sidewalls 450 to ensure that light emitted by light-emitting assembly 201 passes through a large portion of switch housing 400 and subsequently illuminates keycap 300 of low-travel keyboard assembly 200. That is, by substantially surrounding light-emitting assembly 201 with sidewalls 450 of light source recess 404, a majority of light ($L_{1-3}$) may directly pass through switch housing 400 and/or switch housing 400 may reflect light ($L_{1-3}$) toward keycap 300.

As shown in FIG. 7, light-emitting assembly 201 may be surrounded by a curable, transparent resin 236 (hereafter, "resin 236") that may be positioned between light-emitting assembly 201 and sidewalls 450 of light source recess 404 of switch housing 400. Resin 236 may be formed or placed over light-emitting assembly 201 after light-emitting assembly 201 is positioned within light source recess 404 of switch housing 400, to retain light-emitting assembly in light source recess 404 and/or to seal light-emitting assembly 201 from outside contaminants (e.g., water). Additionally, resin 236 may aid in dissipating heat from light-emitting assembly during operation of low-travel keyboard assembly 200. Furthermore, the transparent characteristics or properties of resin 236 may allow light to pass through resin 236 toward recess 502 to aid in illuminating the perimeter of keycap 300, as discussed herein.

Figure 8:
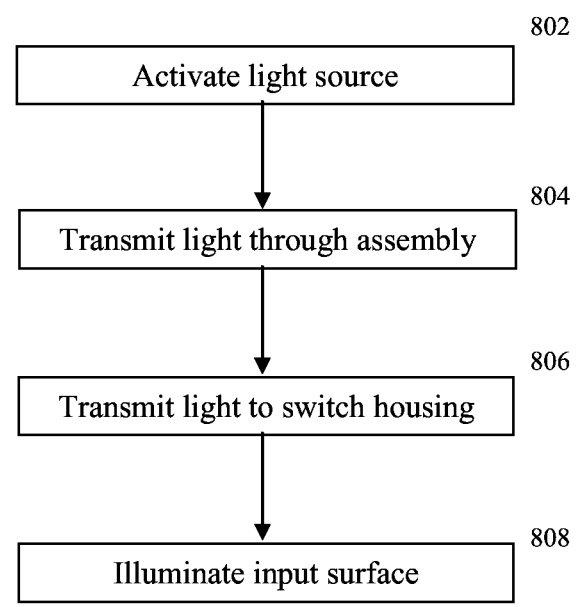
FIG. 8 is a flowchart illustrating a sample method of illuminating an input surface.

Operation of a sample embodiment will now be described with respect to FIG. 8. Initially, in operation 800 a light source may be activated. Light may be transmitted from the light source and through the light-emitting assembly in operation 802. For example, light may pass through the phosphor structure and/or transparent material of the light-emitting assembly. Likewise, light may be blocked from exiting the assembly in certain directions, for example by the mask layer and/or epoxy. The phosphor material may color-shift the light as it passes therethrough, although this is not necessary.

In operation 804, light may exit the light-emitting assembly and enter an associated switch housing. A body of the switch housing may redirect the light upward, for example toward a top panel of the switch housing. In some embodiments, the body (or portions thereof) may be reflective to facilitate redirection of light. In other embodiments, light may not be substantially redirected or may be moderately or minimally redirected. Further, the top panel may act as a light guide to redirect light from the switch housing toward a key cap or other input surface In operation 806, light may exit the top panel and emanate toward an underside of the key cap or other input surface. In operation 808, the light may illuminate a glyph on the key cap and/or may illuminate a perimeter of the key cap.

Although discussed herein as a keyboard assembly, it is understood that the disclosed embodiments may be used in a variety of input devices used in various electronic devices. That is, low-travel keyboard assembly 200 and the components of the assembly discussed herein may be utilized or implemented in a variety of input devices for an electronic device including, but not limited to, buttons, switches, toggles, wheels, and touch screens.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A keyboard assembly, comprising:
   a switch housing defining a switch opening and a light source recess formed in a sidewall of the switch opening;
   a tactile dome positioned at least partially within the switch opening;
   a keycap positioned above the switch housing and configured to move toward the tactile dome when pressed; and
   a light-emitting assembly positioned within the light source recess of the switch housing, and comprising:
      a light source;
      a luminescent structure at least partially enclosing the light source and defining a front face of the light-emitting assembly;
      an opaque material defining a rear face of the light-emitting assembly, the rear face being positioned opposite the front face;
      a first sidewall defining a first side face of the light-emitting assembly; and
      a second sidewall opposite the first sidewall and defining a second side face of the light-emitting assembly, wherein the switch housing is configured to receive light from each of the front face, the first side face, and the second side face and to guide the received light toward the keycap, wherein the opaque material is configured to prevent light from passing through it.

2. The keyboard assembly of claim 1, wherein the luminescent structure is formed from a phosphor material.

3. The keyboard assembly of claim 1, wherein:
   the switch housing is formed from a substantially transparent material; and
   the light source is configured to emit light through the substantially transparent material of the switch housing.

4. The keyboard assembly of claim 1, wherein the keycap includes a transparent glyph formed through the keycap.

5. The keyboard assembly of claim 4, wherein the light source emits light to at least one of:
   a perimeter of the keycap; and
   the transparent glyph formed through the keycap.

6. The keyboard assembly of claim 1, wherein the light-emitting assembly is substantially surrounded on three sides by sidewalls of the light source recess.

7. The keyboard assembly of claim 6, further comprising a transparent resin positioned over the light-emitting assembly, between the light-emitting assembly and the sidewalls of the light source recess.

8. A method for illuminating a key cap, comprising:
   activating a light source;
   transmitting light from the light source, through a phosphor structure, and into a switch housing into three distinct surfaces of the switch housing;
   redirecting, through the switch housing, the light from the phosphor structure to an underside of the key cap, thereby illuminating a portion of the key cap; and
   blocking at least a portion of the light that is emitted through the phosphor structure and upward toward the key cap;
   blocking at least a portion of the light that is laterally emitted through the phosphor structure opposite at least one of the three distinct surfaces of the switch housing.

9. The method of claim 8, further comprising shifting a color of the light while the light transmits through the phosphor structure.

10. The keyboard assembly of claim 1, further comprising an optical mask positioned at least partially between the light source and an underside of the key cap.

11. A keyboard assembly, comprising:
   a key cap;
   a tactile switch positioned below the key cap;
   a support structure movably supporting the key cap;
   a switch housing positioned below the key cap and defining an opening that surrounds the tactile switch and a recess; and
   a light-emitting assembly positioned at least partially within the recess and configured to direct light into the switch housing along three directions, wherein the switch housing defines a light guide configured to channel light received from the light-emitting assembly toward an underside of the key cap;
   an opaque material positioned on a side of the light-emitting assembly and configured to at least partially block light from exiting the light-emitting assembly along a fourth direction, the fourth direction being opposite one of the three directions.

12. The keyboard assembly of claim 11, further comprising an optical mask positioned at least partially between the light emitting assembly and the underside of the key cap.

13. The keyboard assembly of claim 11, wherein
the light-emitting assembly further comprises a phosphor structure at least partially surrounding a light source;
the light-emitting assembly defines a front face and two side faces adjoining the front face;
the light is coupled into the switch housing from the front face and the two side faces of the light-emitting assembly.

14. The keyboard assembly of claim 13, wherein the light-emitting assembly further comprises:
a first transparent sidewall extending from a first end of the front face and defines a first of the two side faces; and
a second transparent sidewall extending from a second end of the front face defines a second of the two side faces.

15. The keyboard assembly of claim, 13, wherein the light source is embedded within the phosphor structure.

16. The keyboard assembly of claim 11, wherein:
the key cap defines an illuminable symbol; and
the switch housing is configured to illuminate the illuminable symbol by propagating light received from the light-emitting assembly toward the underside of the key cap.

17. The keyboard assembly of claim 11, wherein:
the switch housing propagates light toward the underside of the key cap through the opening.

18. The keyboard assembly of claim 11, further comprising:
a top panel positioned over the opening and between the tactile switch and the key cap.

19. The keyboard assembly of claim 18, wherein the top panel defines a light guide.

20. The keyboard assembly of claim 18, wherein the tactile switch is a collapsible dome configured to buckle in response to movement of the top panel into the opening corresponding to a keypress received at the key cap.

* * * * *